(12) United States Patent
Lee et al.

(10) Patent No.: US 7,015,739 B2
(45) Date of Patent: Mar. 21, 2006

(54) INTEGRATED CIRCUIT DEVICES HAVING DUTY CYCLE CORRECTION CIRCUITS THAT RECEIVE CONTROL SIGNALS OVER FIRST AND SECOND SEPARATE PATHS AND METHODS OF OPERATING THE SAME

(75) Inventors: Woo-Jin Lee, Seoul (KR); Kyu-Hyoun Kim, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 14 days.

(21) Appl. No.: 10/793,001

(22) Filed: Mar. 4, 2004

(65) Prior Publication Data

US 2004/0189364 A1    Sep. 30, 2004

(30) Foreign Application Priority Data

Mar. 28, 2003    (KR) ...................... 10-2003-0019653

(51) Int. Cl.
*H03K 3/017*    (2006.01)
(52) U.S. Cl. ....................................... 327/175; 327/296
(58) Field of Classification Search ........ 327/172–175, 327/291–296
See application file for complete search history.

(56) References Cited

U.S. PATENT DOCUMENTS

| | | | |
|---|---|---|---|
| 5,155,397 A | * | 10/1992 | Fassino et al. ................. 327/54 |
| 5,572,158 A | * | 11/1996 | Lee et al. ..................... 327/175 |
| 6,373,309 B1 | * | 4/2002 | Bang ........................... 327/175 |
| 6,525,581 B1 | * | 2/2003 | Choi ............................ 327/175 |
| 6,566,925 B1 | * | 5/2003 | Ma ............................. 327/175 |
| 6,583,657 B1 | * | 6/2003 | Eckhardt et al. ............ 327/175 |

FOREIGN PATENT DOCUMENTS

KR         2002-44191         6/2002

OTHER PUBLICATIONS

Korean Intellectual Office, "Notice to File a Response/Amendment to the Examination Report" Corresponding to Korean Patent aplication 10-2003-0019653, mailed May 30, 2005.

* cited by examiner

*Primary Examiner*—Minh Nguyen
(74) *Attorney, Agent, or Firm*—Myers Bigel Sibley & Sajovec

(57) ABSTRACT

Digital duty cycle correction circuits are provided including a duty cycle detector circuit configured to generate first and second control values associated with a first internal clock signal and a second internal clock signal, respectively. A comparator circuit is also provided and is configured to compare the first control value to the second control value and provide a comparison result. A counter circuit is configured to perform an addition and/or a subtraction operation responsive to the comparison result to provide a digital code. A digital to analog converter is configured to generate third and fourth control values responsive to the digital code. Finally, a duty cycle corrector circuit is configured to receive first and second external clock signals and the first through fourth control values and generate the first and second internal clock signals having a corrected duty cycle. The first and second control values are received over a first path and the third and fourth control values are received over a second path, different from the first path. Related methods of operating duty cycle correction circuits are also provided.

17 Claims, 11 Drawing Sheets

INTEGRATED CIRCUIT DEVICES HAVING DUTY CYCLE CORRECTION CIRCUITS THAT RECEIVE CONTROL SIGNALS OVER FIRST AND SECOND SEPARATE PATHS AND METHODS OF OPERATING THE SAME

RELATED APPLICATION

This application is related to and claims priority from Korean Patent Application No. 2003-19653 filed on Mar. 28, 2003, the disclosure of which is hereby incorporated herein by reference as if set forth in its entirety.

FIELD OF THE INVENTION

The present invention relates to integrated circuit devices and methods of operating the same and, more particularly, to integrated circuit devices having duty cycle correction circuits and methods of operating the same.

BACKGROUND OF THE INVENTION

Recently, the speed of integrated circuit memory devices, for example, dynamic random access memories (DRAMs), has increased to improve the performance of existing systems. However, increasing demand for improved systems may require DRAMs that can process even more data at even higher speeds. Accordingly, synchronous dynamic random access memories (SDRAMs) that operate in synchronization with system clocks have been developed for high-speed operation, thus significantly increasing data transmission speeds.

There are limitations on the amount of data that may be input to and/or output from a memory device per cycle of a system clock. To address these limitations, dual data rate (DDR) SDRAMs have been recently developed in order to further increase the transmission speed of data. DDR SDRAMS input and/or output data in synchronization on both the rising edge and the falling edge of a clock.

Reliable data transmission may be possible when the duty cycle of a clock signal is equivalent to 50% (a 50/50 duty cycle) in an integrated circuit memory device, for example, a DDR SDRAM or a direct rambus dynamic random access memory (RDRAM). Thus, when a clock signal having a duty cycle that is greater than or less than 50% is provided as an input, the device may not perform very well. Duty cycle correction circuits have been developed to address this problem.

As stated, for reliable operation internal clocks used in integrated circuit memory devices are preferably symmetric, i.e., have a duty cycle of about 50%. However, external clocks input into integrated circuit memory devices are typically asymmetric, i.e., the duty cycle is not 50% and may be further distorted by characteristics of the integrated circuit memory device. Duty cycle correction circuits receive external clock signals and generate internal clock signals having duty cycles of about 50%.

Conventional duty cycle correction circuits may be analog or digital. Referring now to FIG. 1, a block diagram illustrating conventional analog duty cycle correction circuits will be discussed. As illustrated in FIG. 1, the analog duty cycle correction circuit 100 includes a duty cycle detector circuit 104 and a duty cycle corrector circuit 102. The duty cycle detector circuit 104 may generate different output voltages based upon the duty cycle(s) of the input clock signal(s). The duty cycle corrector circuit 102 may be configured to receive first and second external clock signals ECLK and ECLKB and generate first and second input clock signals having a duty cycle of about 50% based on the voltages generated by the duty cycle detector circuit 104, i.e., to correct the duty cycle of the clock of the clocks using the voltages dcc and dccb provided by the duty cycle detector circuit 104.

The duty cycle detector circuit 104 may include a charge pump 103 as, for example, illustrated in FIG. 2. Referring now to FIG. 2, the charge pump 103 is configured to charge a capacitor C21 when the clock signal CLK is at a logic high level and discharge the capacitor C21 when the clock CLK is at a logic low level. The duty cycle detector circuit 104 may also be configured to output an average charge value voltage Vcp indicating the charge stored in the capacitor C21. Typically, the duty cycle detector circuit 104 includes first and second charge pumps coupled to first and second input clock signal lines. Thus, the duty cycle detector circuit 104 may output first and second average charge values dcc and dccb (FIG. 1) corresponding to the internal clock signal ICLK and complementary internal clock signal ICLKB, respectively.

Referring now to FIG. 3, a graph illustrating outputs of the duty cycle detector circuit 104 as a time function (seconds) with respect to voltage (V) will be discussed. As illustrated in FIG. 3, when power is supplied to the integrated circuit device, the duty cycle detector circuit 104 outputs first and second average charge values dcc and dccb corresponding to the first and second charge pumps, respectively, of the duty cycle detector circuit 104. The first and second average charge values dcc and dccb correspond to the first and second internal clock signals ICLK and ICLKB. The difference 302 between the first and second average charge values dcc and dccb increases as the difference between the duty cycles of the first and second input clock signals increases. When the first and second input clock signals ICLK and ICLKB have a duty cycle of 50%, the average charge values dcc and dccb are typically the same.

Referring now to FIG. 4, a schematic circuit diagram illustrating a duty cycle corrector circuit 102 used in conventional duty cycle correction circuits will be discussed. As illustrated in FIG. 4, the duty cycle corrector circuit 102 includes a differential amplifier circuit. The differential amplifier circuit may be configured to receive first and second external clock signals ECLK and ECLKB and generate first and second internal clock signals ICLK and ICLKB having a 50% duty cycle based on first and second average charge values dcc and dccb, respectively, provided by the duty cycle detector circuit 104. However, the analog duty cycle correction circuit may experience a time delay while the capacitors of the charge pumps are recharged after power is supplied to the integrated circuit memory device.

Time delay issues with respect to analog duty cycle correction circuits have been addressed by, for example, providing digital duty cycle correction circuits. Conventional digital duty cycle correction circuits may include an analog duty cycle correction circuit and/or a delay-locked loop (DLL) circuit.

Referring now to FIG. 5, a block diagram illustrating a digital duty cycle correction circuit 500 including an analog duty cycle correction circuit will be discussed. The digital duty cycle correction circuit 500 may convert first and second outputs dcc2 and dcc2b of a duty cycle detector circuit 504 into digital signals using an analog to digital converter 506 and may use a counter circuit 508 to save the results. The digital duty cycle correction circuit 500 converts the digital signals saved in the counter circuit 508 back to analog signals using the digital to analog converter 510, and provides the first and second outputs of the digital to analog converter 510 to the duty cycle corrector circuit 502 to correct the duty cycle of the first and second external clock signals ECLK and ECLKB.

The digital duty cycle correction circuit 500 saves the digitized information when power is removed from the integrated circuit memory device. Thus, when the power is resupplied to the integrated circuit memory device, the digital duty cycle correction circuit 500 can use the saved digital information by converting the information into analog signals using the digital to analog converter 510. The digital duty cycle correction circuit illustrated in FIG. 5 may include additional circuitry to implement the operations discussed above. Accordingly, the overall size of the integrated circuit may be increased. The increase in size may be a problem as the size of integrated circuit devices continue to decrease.

Referring now to FIG. 6, a block diagram illustrating a digital duty cycle correction circuit 600 including DLL circuits will be discussed. FIG. 7 is a timing diagram illustrating timing operations of the digital duty cycle correction circuit 600. As illustrated in FIG. 6, the digital duty cycle correction circuit includes first and second DLL circuits 602 and 604 for correcting duty cycles of first and second external clock signals ECLK and ECLKB. The first DLL circuit 602 generates a first clock signal CLK_R that is synchronized to a rising edge of an external clock signal ECLK and the second delay-locked loop circuit 604 generates a second clock CLK_F that is synchronized to a falling edge of the external clock signal ECLK. The second clock signal CLK_F is inverted using a first inverter U62 and becomes a third clock signal CLK_S. As illustrated, the digital duty cycle correction circuit 600 may also include second through fourth inverters U61, U63 and U64.

If the rising edges of the first and third clock signals CLK_R and CLK_S have a 50/50 duty cycle as illustrated in FIG. 7, an input clock signal ICLK having a 50/50 (A=B) duty cycle may be generated. A digital duty cycle correction circuit 600 including a DLL circuit may be smaller than a digital duty cycle correction circuit including an analog duty cycle correction circuit, but typically includes a DLL circuit because it uses a delay line of the DLL circuit.

SUMMARY OF THE INVENTION

Embodiments of the present invention provide digital duty cycle correction circuits including a duty cycle detector circuit configured to generate first and second control values associated with a first internal clock signal and a second internal clock signal, respectively. A comparator circuit is also provided and is configured to compare the first control value to the second control value and provide a comparison result. A counter circuit is configured to perform an addition and/or a subtraction operation responsive to the comparison result to provide a digital code. A digital to analog converter is configured to generate third and fourth control values responsive to the digital code. Finally, a duty cycle corrector circuit is configured to receive the first through fourth control values and generate the first and second internal clock signals having a corrected duty cycle. The first and second control values are received at the duty cycle corrector circuit over a first path and the third and fourth control values are received at the duty cycle corrector circuit over a second path. The second path is separate from the first path.

In some embodiments of the present invention, the first and second control values may be directly provided to the duty corrector circuit over the first path and the third and fourth control values may be directly provided to the duty corrector circuit over the second path. The duty cycle detector circuit may include a first charge pump configured to generate the first control value and a second charge pump configured to generate the second control value. The first and second charge pumps may include first and second capacitors, respectively. The first control value may include an average charge of the first capacitor and the second control value may include an average charge of the second capacitor.

In further embodiments of the present invention, the comparison result may include a logic high signal or a logic low signal. The comparator circuit may be further configured to compare the first control value and the second control value and generate the logic high signal if the first control values is greater than the second control value and generate the logic low signal if the second control value is greater than the first control value. The counter circuit may be further configured to receive the logic high signal or the logic low signal and perform the addition operation responsive to the logic high signal and the subtraction operation responsive to the logic low signal. In certain embodiments of the present invention, the duty cycle correction circuit may include a differential amplifier and the corrected duty cycle may be about 50%.

While the present invention is described above primarily with reference to digital duty cycle correction circuits, methods of operating digital duty cycle correction circuits are also provided herein.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. It will be understood that when an element is referred to as being "coupled" or "connected" to another element, it can be directly coupled to or connected to the other element or intervening elements may also be present. It will be further understood that when an element is referred to as being "directly coupled" or "directly connected" to another element, no intervening elements may be present. Like numbers refer to like elements throughout.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of the present invention.

Embodiments of the present invention will be described below with respect to FIGS. 8 through 13. Embodiments of the present invention provide digital duty cycle correction circuits that may include a one-bit analog to digital converter and may operate without the inclusion of a delay-locked loop circuit. Thus, digital duty cycle correction circuits according to some embodiments of the present invention may occupy a relatively small amount of space in the integrated circuit memory device, which may allow the overall size of the integrated circuit device to be decreased.

Figure 1:
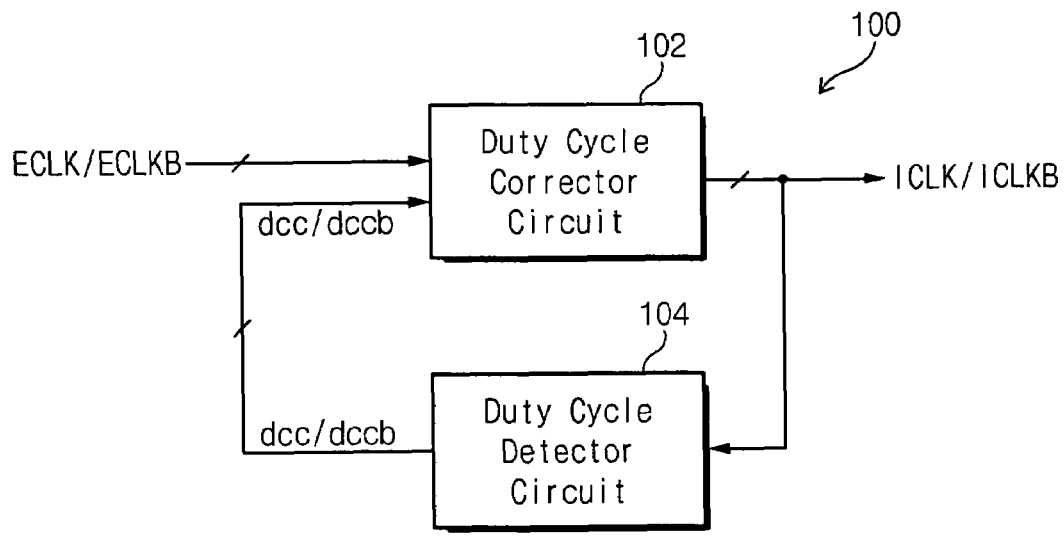
FIG. 1 is a block diagram illustrating conventional analog duty cycle correction circuits.
Figure 2:
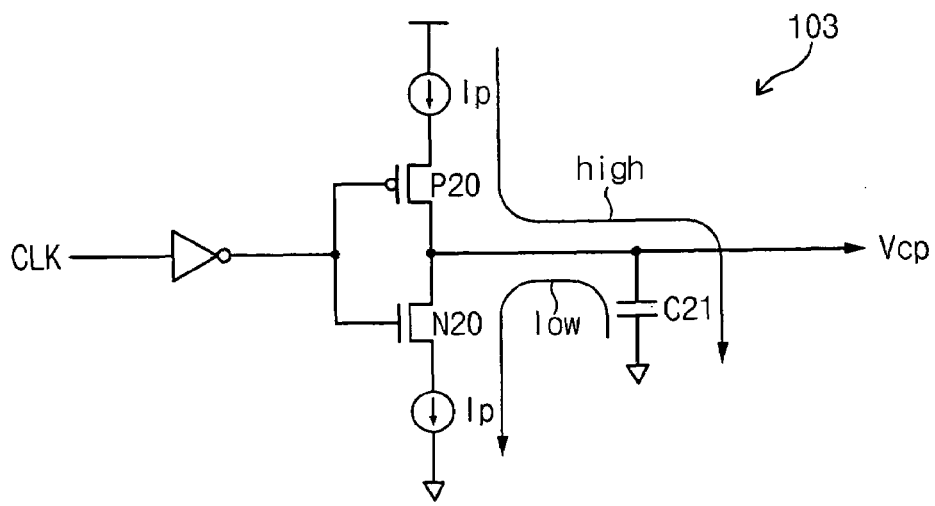
FIG. 2 is a circuit diagram illustrating charge pumps used as duty cycle detector circuits in conventional duty cycle correction circuits.
Figure 3:
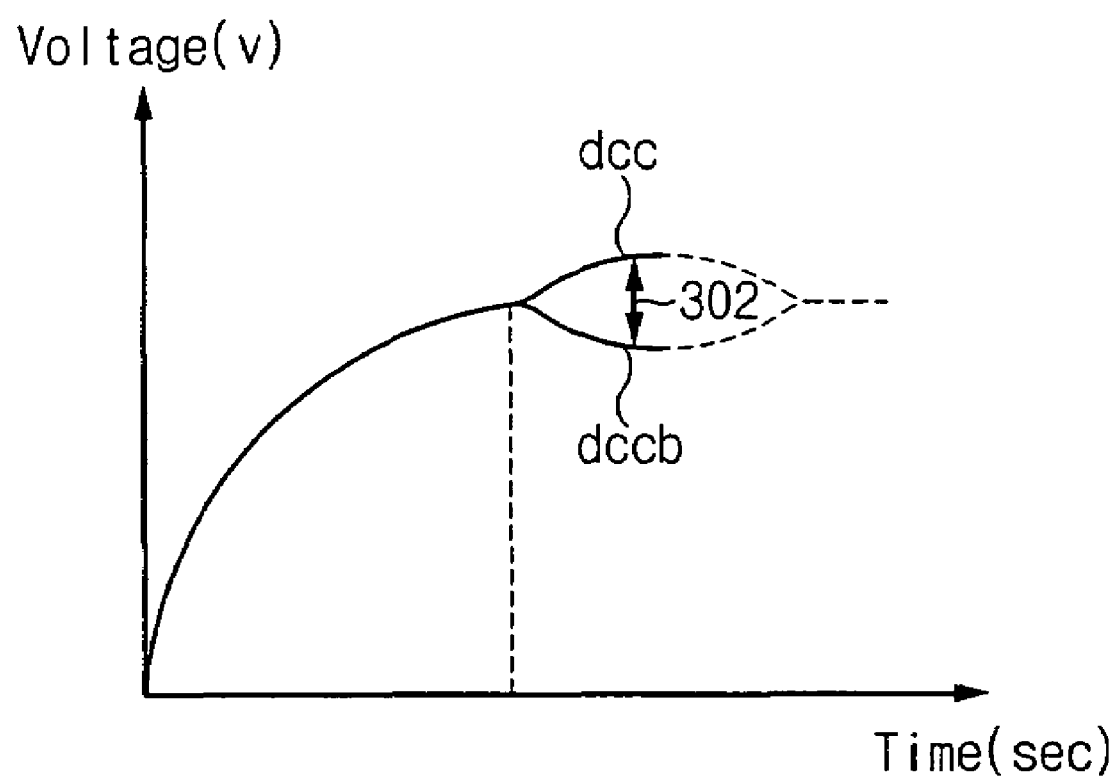
FIG. 3 is a waveform diagram illustrating average charge values saved in capacitors of charge pumps illustrated in FIG. 2.
Figure 4:
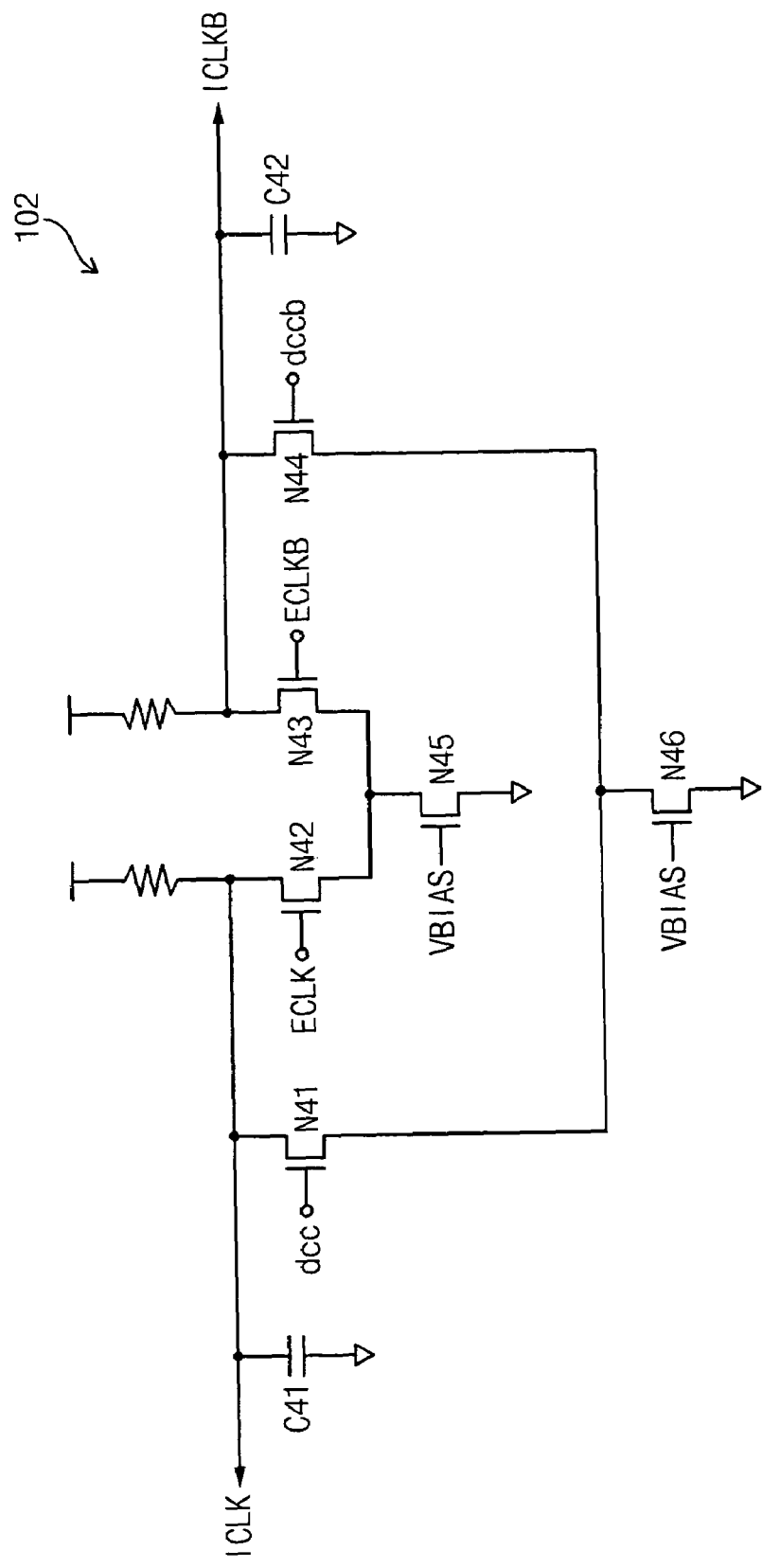
FIG. 4 is a schematic circuit diagram illustrating duty cycle corrector circuits used in conventional duty cycle correction circuits.
Figure 5:
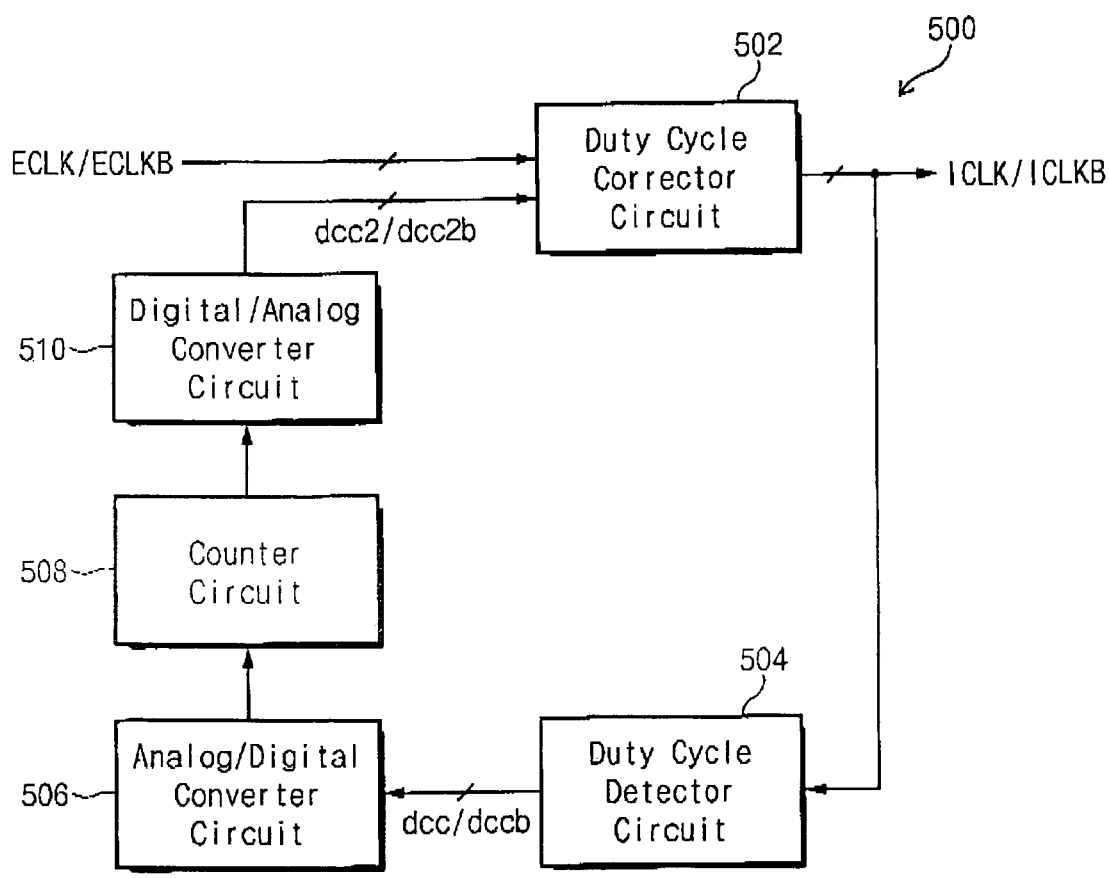
FIG. 5 is a block diagram illustrating conventional digital duty cycle correction circuits including an analog duty cycle correction circuit.
Figure 6:
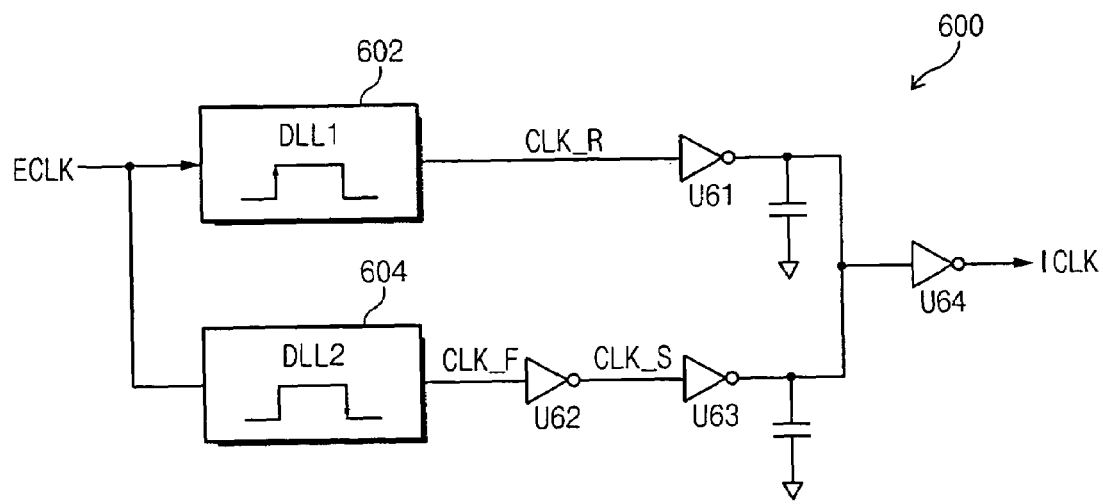
FIG. 6 is a diagram illustrating conventional digital duty cycle correction circuits including delay-locked loop (DLL) circuits.
Figure 7:
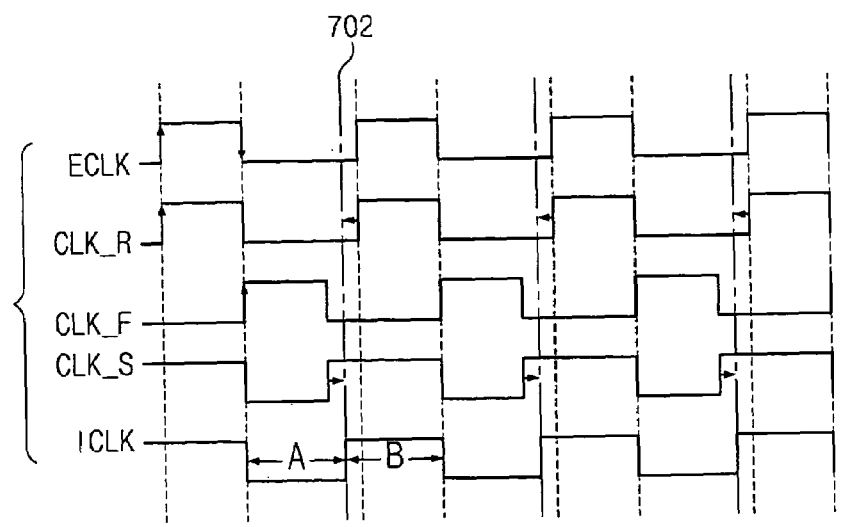
FIG. 7 is a timing diagram illustrating timing operations of conventional digital duty cycle correction circuits illustrated in FIG. 6.
Figure 8:
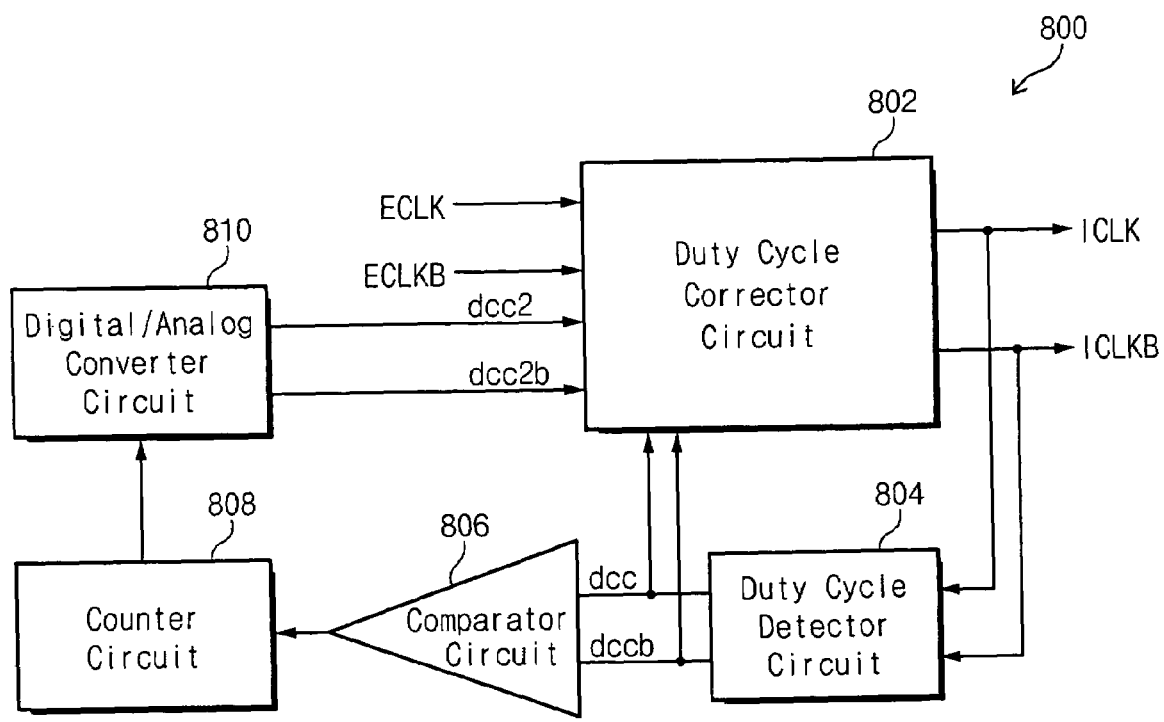
FIG. 8 is a block diagram illustrating digital duty cycle correction circuits according to some embodiments of the present invention.
Figure 9A:
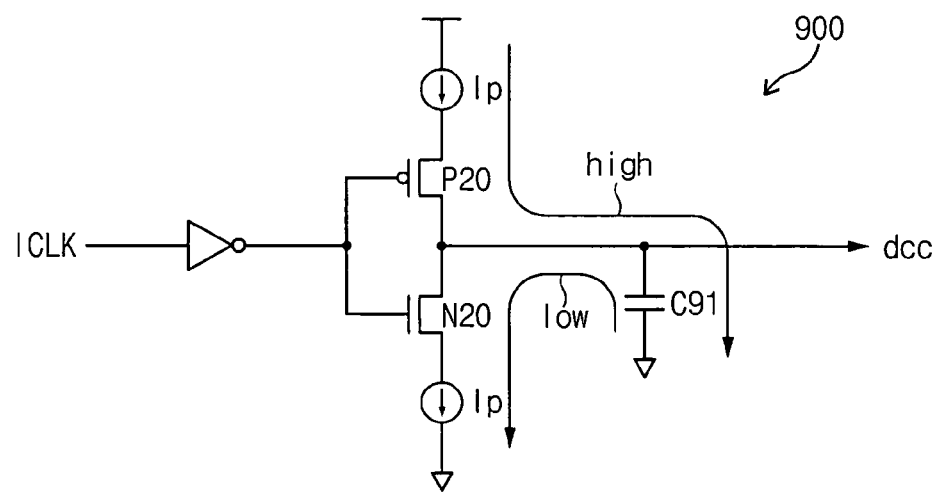
FIGS. 9A and 9B are circuit diagrams illustrating first and second charge pumps, respectively, used in duty cycle detector circuits according to some embodiments of the present invention.
Figure 9B:
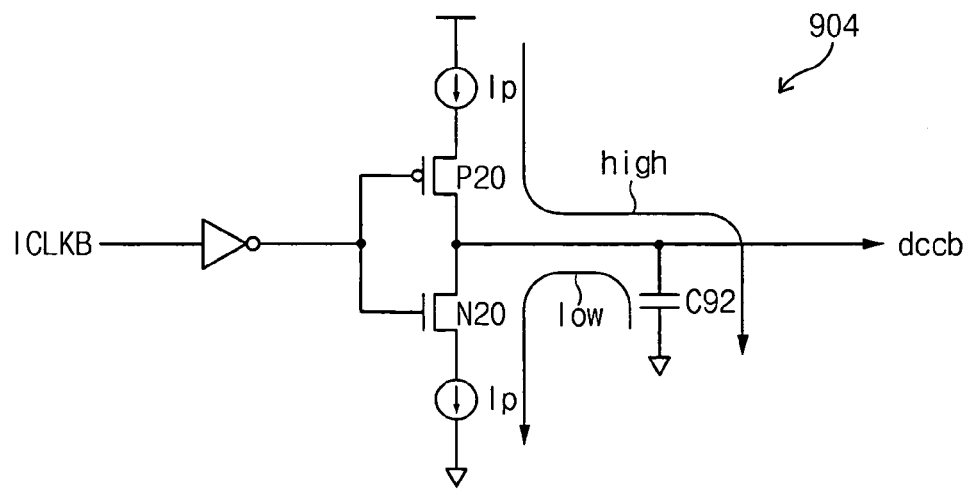

Referring now to FIG. 8, a block diagram illustrating digital duty cycle correction circuits 800 according to some embodiments of the present invention will be discussed. As illustrated in FIG. 8, a pair of differential internal clock signals ICLK and ICLKB are output from a duty cycle corrector circuit 802. In other words, a first internal clock signal ICLK and a second (complementary) internal clock signal ICLKB are output from the duty cycle corrector circuit 802. The pair of differential internal clock signals ICLK and ICLKB are provided to a duty cycle detector circuit 804. The duty cycle detector circuit 804 is configured to charge and/or discharge a capacitor responsive to the pair of differential internal clock signals ICLK and ICLKB. The duty cycle detector circuits 804 includes at least one charge pump circuit, for example, the charge pump circuit illustrated in FIG. 9A. Duty cycle detector circuits 804 according to some embodiments of the present invention discussed herein include first and second charge pumps 900 and 905 in the duty cycle detector 804 as illustrated in FIGS. 9A and 9B, respectively. However, it will be understood that embodiments of the present invention are not limited to this configuration. The first charge pump circuit 900 of the duty cycle detector circuit 804 may generate an average charge value dcc stored in the first capacitor C91. Similarly, the second charge pump circuit 905 may generate a complementary average charge value dccb stored in the second capacitor C92.

Referring again to FIG. 8, the first and second average charge values dcc and dccb (first and second control values) are compared and converted into digital signals by, for example, a comparator circuit 806. In some embodiments of the present invention, the comparator circuit 806 generates a comparison result. In particular, the comparator circuit may be configured to generate a logic high signal or a "1" when the average charge value dcc is greater than the complementary average charge value dccb and a logic low signal or "0" when the average charge value dcc is less than the complementary average charge value dccb. In other words, the comparator circuit 806 converts the first and second average charge values dcc and dccb, which are analog signals, into digital signals, i.e. logic highs and lows. In these embodiments of the present invention, the comparator circuit 806 operates as a 1-bit analog to digital converter circuit.

The digital signals generated by the comparator circuit 806 are provided to an input of a counter circuit 808. The counter circuit 808 may be configured to perform an addition operation when the signal provided by the comparator circuit 806 is at a logic high level or a "1". The counter circuit 808 may be further configured to perform a subtraction operation when the signal provided by the comparator circuit 806 is at a logic low level or a "0". The values calculated by the counter circuit 808 are saved by the digital duty cycle correction circuit in, for example, the counter circuit 808. The digital values saved in the counter circuit 808 may be converted into first and second analog signals dcc2 and dcc2b by a digital to analog converter 810 and may be provided to a duty cycle corrector circuit 802.

It will be understood that embodiments of the present invention illustrated in FIG. 8 are provided for exemplary purposes only and that embodiments of the present invention are not limited to this configuration. For example, the operations of the comparator circuit 806 could be performed by an analog to digital converter without departing from the scope of the present invention.

Figure 10:
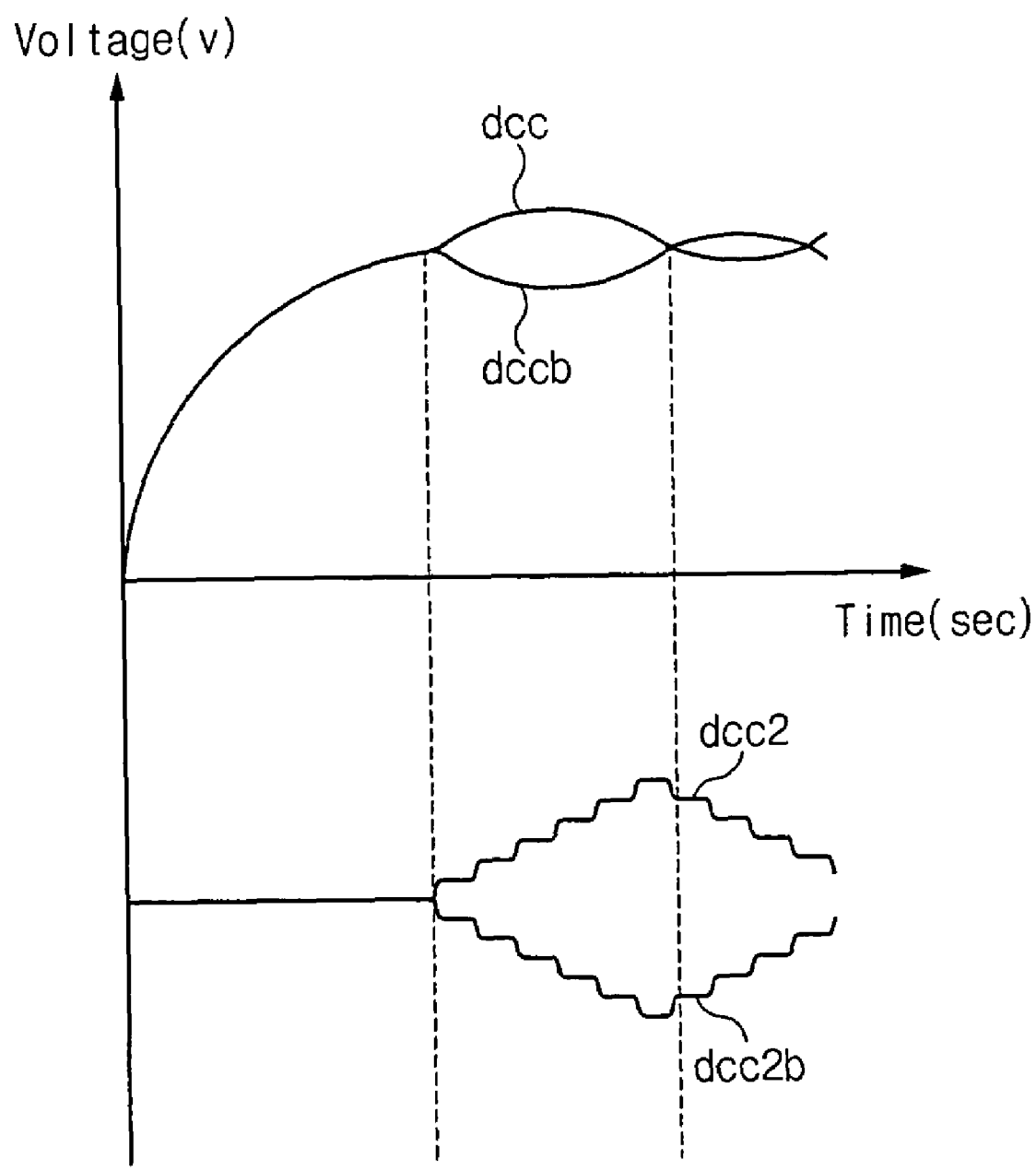
FIG. 10 is a waveform diagram illustrating average charge values provided by duty cycle detector circuits and signals of digital to analog converters according to some embodiments of the present invention.

Referring now to FIG. 10, a waveform diagram illustrating a relationship between the first average charge value dcc and the second (complementary) average charge value dccb output from the duty cycle detector circuit 804 and the first and second analog signals dcc2 and dccb2 (third and fourth control values) output from the digital to analog converter 810 will be discussed. As illustrated in FIG. 9, when the average charge value dcc is greater than the complementary average charge value dccb, the first analog signal dcc2 increases as the second analog signal dcc2b decreases, thereby increasing a difference between the two signals. In contrast, as illustrated, when the average charge value dcc is less than the complementary average charge value dccb, the first analog signal dcc2 decreases and the second analog signal dcc2b increases, thereby reducing the difference between the two signals.

Referring again to FIG. 8, the duty cycle corrector circuit 802 receives a first external clock signal ECLK and a second (complementary) external clock signal ECLKB, first and second average charge values dcc and dccb from the duty cycle detector circuit 804 over a first path, and first and second analog signals dcc2 and dcc2b from the digital to analog converter circuit 810 over a second path, different from the first path, and generates first and second internal clock signals ICLK and ICLKB having a corrected duty cycle. As used herein, "a corrected duty cycle" refers to adjustments made to the duty cycle so that the duty cycle approaches 50% compared to the duty cycle of the external clock. As discussed above, a 50% duty cycle is ideal, however, a duty cycle of about 50% can be obtained.

Figure 11:
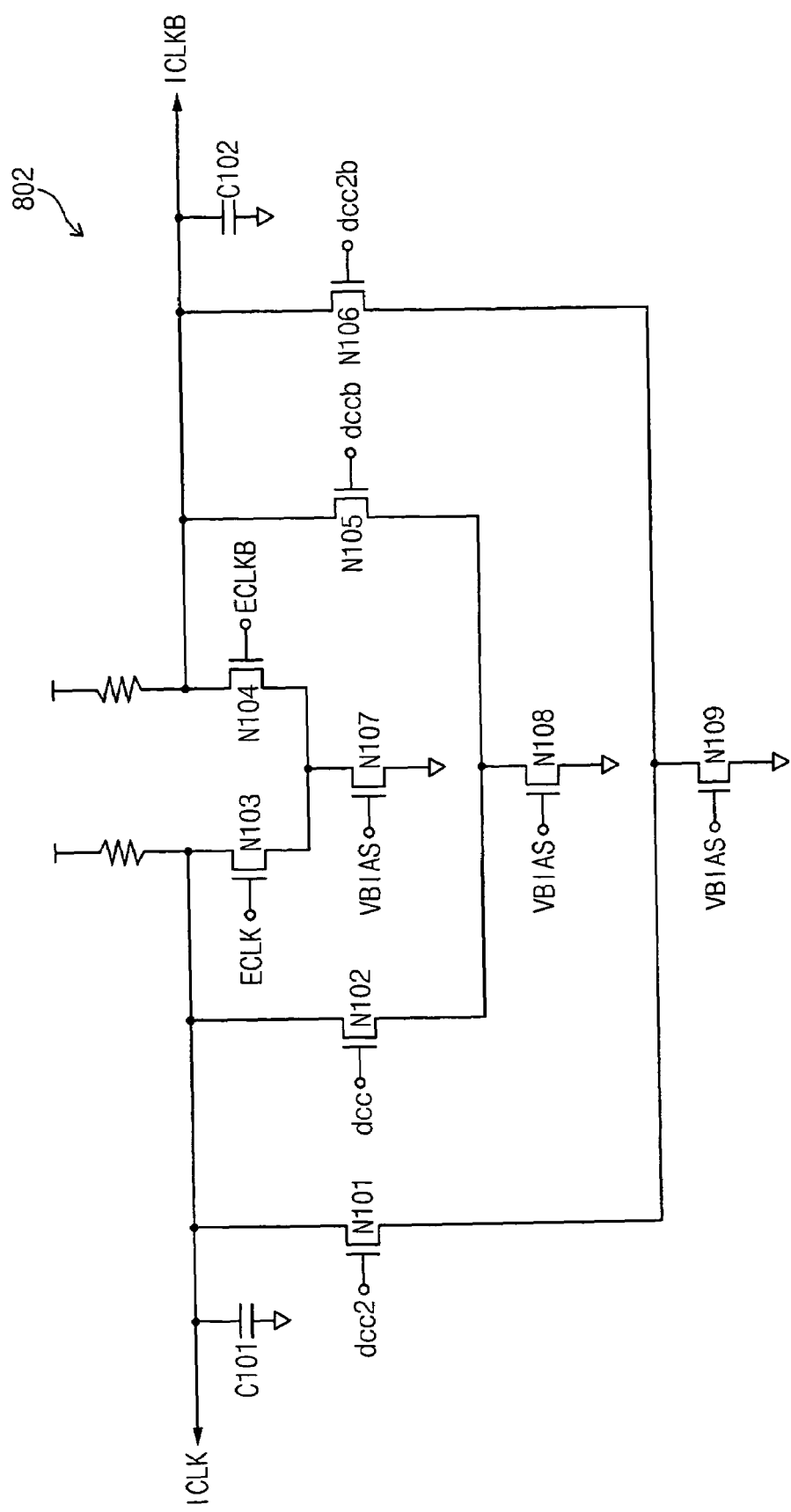
FIG. 11 is a schematic circuit diagram illustrating digital corrector circuits according to some embodiments of the present invention.

Referring now to FIG. 11, a schematic circuit diagram illustrating a duty cycle corrector circuit according to some embodiments of the present invention will be discussed. As illustrated in FIG. 11, duty cycle corrector circuits according to embodiments of the present invention may include a differential amplifier. In particular, the duty cycles of the first and second external clock signals ECLK and ECLKB are input into the duty cycle corrector circuit 802. The values of the first and second average charge values dcc and dccb and the first and second analog signals dcc2 and dcc2b are provided to first, second, third and fourth Negative-Channel Metal Oxide Semiconductor (NMOS) transistors N101, N102, N105, and N106, respectively, and are converted into the first and second internal clock signals ICLK and ICLKB.

Figure 12:
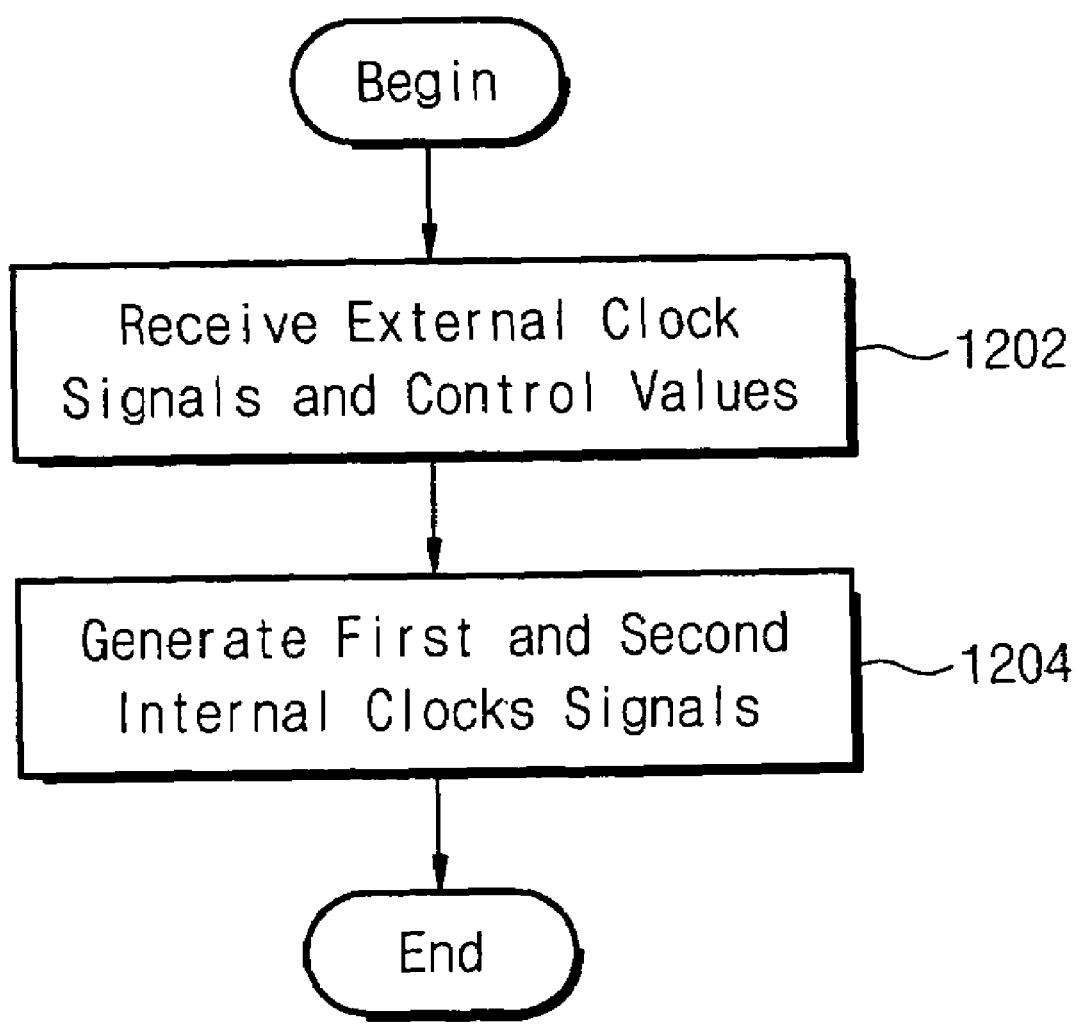
FIG. 12 is a flowchart illustrating operations of digital duty cycle correction circuits according to some embodiments of the present invention.

Referring now to the flowchart of FIG. 12, operations of digital duty cycle correction circuits according to some embodiments of the present invention will be discussed. Operations begin at block 1202 by receiving first and second external clock signals and first through fourth control values at, for example, a duty cycle corrector circuit. First and second internal clock signals are generated having a corrected duty cycle based on the first and second external clock signals and first through fourth control values (block 1204).

Figure 13:
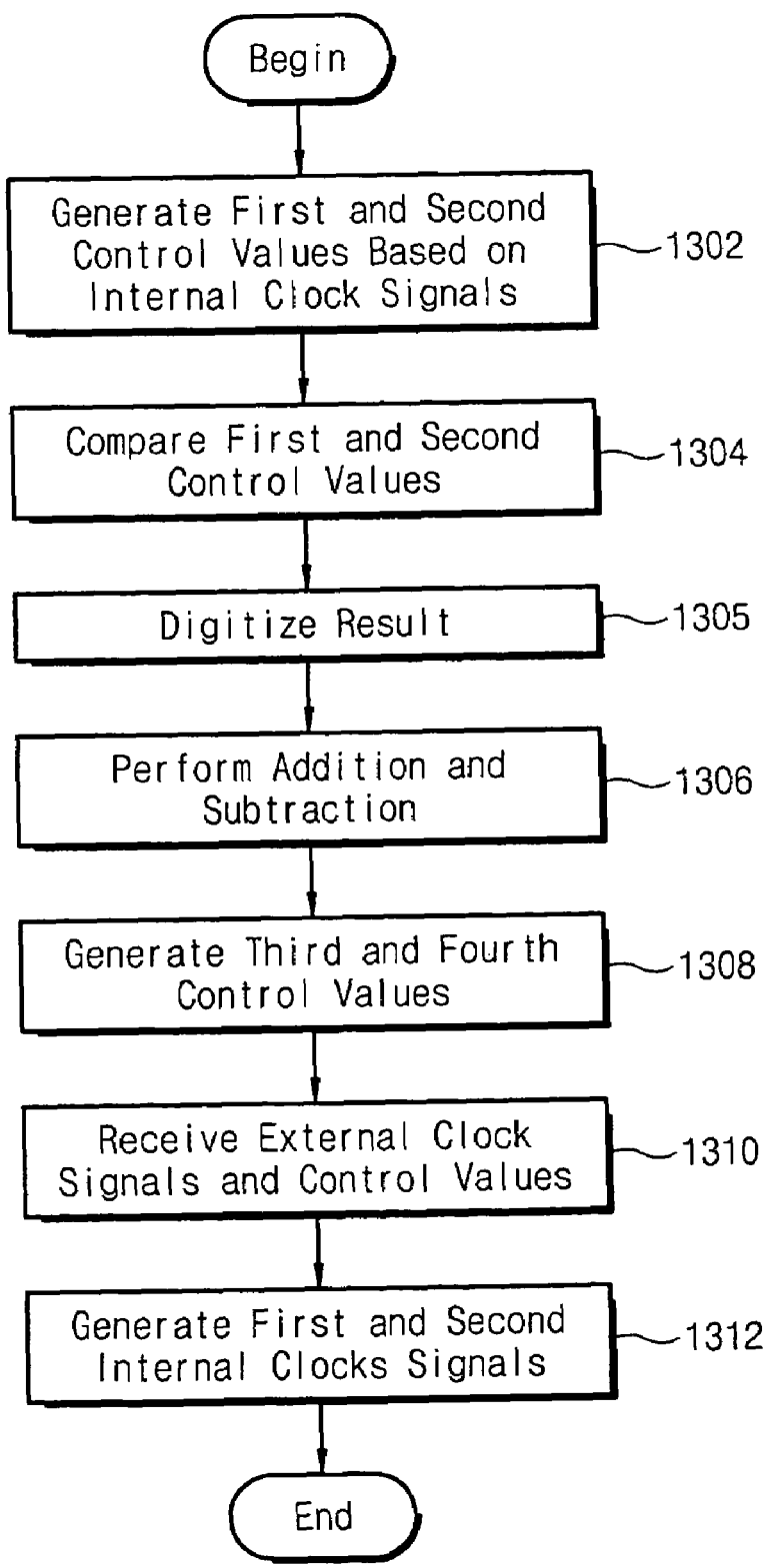
FIG. 13 is a flowchart illustrating further operations of digital duty cycle correction circuits according to further embodiments of the present invention.

Referring now to the flowchart of FIG. 13, operations of digital duty cycle correction circuits according to further embodiments of the present invention will be discussed. Operations begin at block 1302 by generating first and second average charge values (first and second control values) based on first and second internal clock signals. In some embodiments of the present invention, the first internal clock signal has an average charge value referred to as "dcc". Furthermore, the complementary internal clock signal has a complementary average charge value that is referred to as "dccb". The generated average charge values are compared to one another (block 1304) and converted into a digital signal (block 1305). For example, a comparator circuit may be provided and may be configured to output a signal having a logic high level or a "1" when the average charge value of the internal clock signal dcc is greater than the average charge value of the complementary internal clock signal dccb. In contrast, when the average charge value of the internal clock signal dcc is less than the average charge value of the complementary internal clock signal dccb, the comparator circuit may be configured to output a signal have a logic low level or a "0". The output of the comparator circuit may be received at a counter. Operations of the counter circuit may be controlled responsive to the output of the comparator circuit (block 1306). For example, when the comparator circuit generates a signal having a logic high level or a "1", the counter circuit may perform an addition operation. Furthermore, when the comparator circuit generates a signal having a logic low level or a "0", the counter circuit may perform a subtraction operation. The result of the addition and/or subtraction may be saved in the counter circuit and may be converted into first and second analog signals (third and fourth control values) by, for example, a digital to analog converter (block 1308). The first and second analog signals and the first and second average charge values are provided to a duty cycle corrector circuit (block 1310). The duty cycle corrector circuit may be used to correct the duty cycles of the external clock signals to generate a corrected first and second internal clock signals having a duty cycle of about 50% (block 1312).

As discussed briefly above with respect to FIGS. 8 through 13, embodiments of the present invention provide digital duty cycle correction circuits that may include a one-bit analog to digital converter and may operate without the inclusion of a delay-locked loop circuit. Thus, digital duty cycle correction circuits according to embodiments of the present invention may occupy a relatively small amount of space, which may allow the overall size of the integrated circuit device to be decreased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A digital duty cycle correction circuit, comprising:
   a duty cycle detector circuit configured to generate first and second control values associated with a first internal clock signal and a second internal clock signal, respectively;
   a comparator circuit configured to compare the first control value to the second control value and provide a comparison result;
   a counter circuit configured to perform an addition or a subtraction operation responsive to the comparison result to provide a digital code;
   a digital to analog converter configured to generate third and fourth control values responsive to the digital code; and
   a duty cycle corrector circuit configured to receive the first through fourth control values and generate the first and second internal clock signals having a corrected duty cycle, the first and second control values being received at the duty cycle corrector circuit over a first path and the third and fourth control values being received at the duty cycle corrector circuit over a second path, separate from the first path.

2. The duty cycle correction circuit of claim 1, wherein the first and second control values are directly provided to the duty corrector circuit over the first path and the third and fourth control values are directly provided to the duty corrector circuit over the second path.

3. The duty cycle correction circuit of claim 1, wherein the duty cycle detector circuit comprises a first charge pump configured to generate the first control value and a second charge pump configured to generate the second control value.

4. The duty cycle correction circuit of claim 3, wherein the first and second charge pumps comprise first and second capacitors, respectively, wherein the first control value comprises an average charge of the first capacitor and the second control value comprises an average charge of the second capacitor.

5. The duty cycle correction circuit of claim 1, wherein the comparison result comprises a logic high signal or a logic low signal, wherein the comparator circuit is further configured to compare the first control value and the second control value and generate the logic high signal if the first control value is greater than the second control value and generate the logic low signal if the second control value is greater than the first control value.

6. The duty cycle correction circuit of claim 5, wherein the counter circuit is further configured to receive the logic high signal or the logic low signal and perform the addition operation responsive to the logic high signal and the subtraction operation responsive to the logic low signal.

7. The duty cycle correction circuit if claim 1, wherein the duty cycle correction circuit comprises a differential amplifier and wherein the corrected duty cycle is about 50%.

8. A digital duty cycle correction circuit, comprising:
- a duty cycle corrector circuit configured to receive first and second external clock signals and first through fourth control values and generate first and second internal clock signals having a corrected duty cycle, the first and second control values being received at the duty cycle corrector circuit over a first path and the third and fourth control values being received at the duty cycle corrector circuit over a second path, separate from the first path;
- a duty cycle detector circuit configured to generate the first and the second control values associated with the first internal clock signal and the second internal clock signal, respectively;
- a comparator circuit configured to compare the first control value to the second control value and provide a comparison result;
- a counter circuit configured to perform an addition and/or a subtraction operation responsive to the comparison result to provide a digital code; and
- a digital to analog converter configured to generate the third and the fourth control values responsive to the digital code.

9. The duty cycle correction circuit of claim 8, wherein the first and second control values are directly provided to the duty corrector circuit over the first path and the third and fourth control values are directly provided to the duty corrector circuit over the second path.

10. The duty cycle correction circuit if claim 9, wherein the duty cycle correction circuit comprises a differential amplifier and wherein the duty cycle is about 50%.

11. The duty cycle correction circuit of claim 8, wherein the duty cycle detector circuit comprises a first charge pump configured to generate the first control value and a second charge pump configured to generate the second control value.

12. The duty cycle correction circuit of claim 11, wherein the first and second charge pumps comprise first and second capacitors, respectively, wherein the first control value comprises an average charge of the first capacitor and the second control value comprises an average charge of the second capacitor.

13. The duty cycle correction circuit of claim 8, wherein the comparison result comprises a logic high signal or a logic low signal, wherein the comparator circuit is further configured to compare the first control value and the second control value and generate the logic high signal if the first control value is greater than the second control value and generate the logic low signal if the second control value is greater than the first control value.

14. The duty cycle correction circuit of claim 13, wherein the counter circuit is further configured to receive the logic high signal and/or the logic low signal and perform the addition operation responsive to the logic high signal and the subtraction operation responsive to the logic low signal.

15. A method of operating a duty cycle correction circuit, comprising:
- generating first and the second control values associated with a first internal clock signal and a second internal clock signal, respectively;
- comparing the first control value to the second control value to provide a comparison result;
- performing an addition or a subtraction operation responsive to the comparison result to provide a digital code;
- generating third and the fourth control values responsive to the digital code;
- receiving the first and second external clock signals and the first through fourth control values at a duty cycle corrector circuit, the first and second control values being received at the duty cycle corrector circuit over a first path and the third and fourth control values being received at the duty cycle corrector circuit over a second path, separate from the first path; and
- generating the first and second internal clock signals having a corrected duty cycle responsive to the first and second external clock signals and the first through fourth control values.

16. The method of claim 15, wherein comparing is followed by:
- generating a logic high signal if the first control value is greater than the second control value; and
- generating a logic low signal if the second control value is greater than the first control value.

17. The method of claim 16, wherein generating the logic high signal or the logic low signal is followed by:
- receiving the logic high signal or the logic low signal and wherein performing further comprises performing the addition operation responsive to the logic high signal and performing the subtraction operation responsive to the logic low signal.

* * * * *